United States Patent
Wang et al.

(10) Patent No.: US 6,613,672 B1
(45) Date of Patent: Sep. 2, 2003

(54) APPARATUS AND PROCESS OF FABRICATING A TRENCH CAPACITOR

(75) Inventors: Tso-Chun Tony Wang, Yi-Lan (TW); Houng-Chi Wei, Taichung (TW)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 09/625,235

(22) Filed: Jul. 25, 2000

(30) Foreign Application Priority Data

Jul. 29, 1999 (TW) ........................................ 88112854 A

(51) Int. Cl.⁷ ............................................ A01L 21/261
(52) U.S. Cl. ........................ 438/689; 438/243; 438/244; 438/246; 438/248
(58) Field of Search ................................ 438/243, 246, 438/244, 248

(56) References Cited

U.S. PATENT DOCUMENTS

| | | | | |
|---|---|---|---|---|
| 6,025,245 A | * | 2/2000 | Wei .............................. | 438/386 |
| 6,066,527 A | * | 5/2000 | Kudelka et al. ............. | 438/243 |
| 6,177,696 B1 | * | 1/2001 | Bronner et al. ............. | 257/301 |
| 6,242,357 B1 | * | 6/2001 | Wei et al. .................... | 438/700 |
| 6,271,079 B1 | * | 8/2001 | Wei et al. .................... | 438/243 |

* cited by examiner

Primary Examiner—Felisa Hiteshew
(74) Attorney, Agent, or Firm—Burns, Doane, Swecker & Mathis LLP

(57) ABSTRACT

A process of fabricating a deep trench capacitor includes the steps of: depositing a nitride masking layer over a substrate; removing portions of the nitride masking layer and substrate to form an exposed deep trench having sidewalls and a bottom surface; forming an oxide fill plug to fill a bottom portion of the trench; removing the oxide fill plug from the trench; doping a region of the substrate enveloping the bottom portion of the trench; depositing a spacer insulating layer over the sidewalls and bottom surface of the trench; removing a portion of the spacer insulating layer to expose a central portion of the bottom surface of the trench; depositing a conducting layer over the spacer insulating layer, and the exposed central portion of the bottom surface, the conducting layer and the doped region of the substrate being in electrical contact and forming a first plate of the capacitor; removing a portion of the conducting layer; removing the spacer insulating layer to expose outer walls of the conducting layer; removing the protection layer; forming a dielectric layer over the sidewalls of the trench and over the top surface, inner walls, and outer walls of the conducting layer; and depositing a conducting plug over the dielectric layer and filling the trench, the conducting plug forming at least a portion of a second plate of the capacitor.

7 Claims, 4 Drawing Sheets

APPARATUS AND PROCESS OF FABRICATING A TRENCH CAPACITOR

BACKGROUND OF THE INVENTION

1. Field of the Invention

The present invention relates generally to a deep trench capacitor, and more specifically to the process of fabricating and the device of a trench capacitor, providing increased capacitance.

2. Description of the Prior Art

An important design goal in the design and fabrication of deep trench capacitors is reduced size. Another design goal in designing and fabricating deep trench capacitors is increased capacitance.

In accordance with some conventional processes for fabricating deep trench capacitors, capacitors are formed above the substrate. This type of structure utilizes some of the limited space above the substrate. Therefore, the available space for fabricating other devices is reduced. In order to provide space for fabricating other devices, and in order to increase the density of devices, the size of the trench capacitor must be reduced or the capacitor may be built within the substrate. A trench type capacitor is a capacitor that is fabricated within the substrate.

Figure 1:
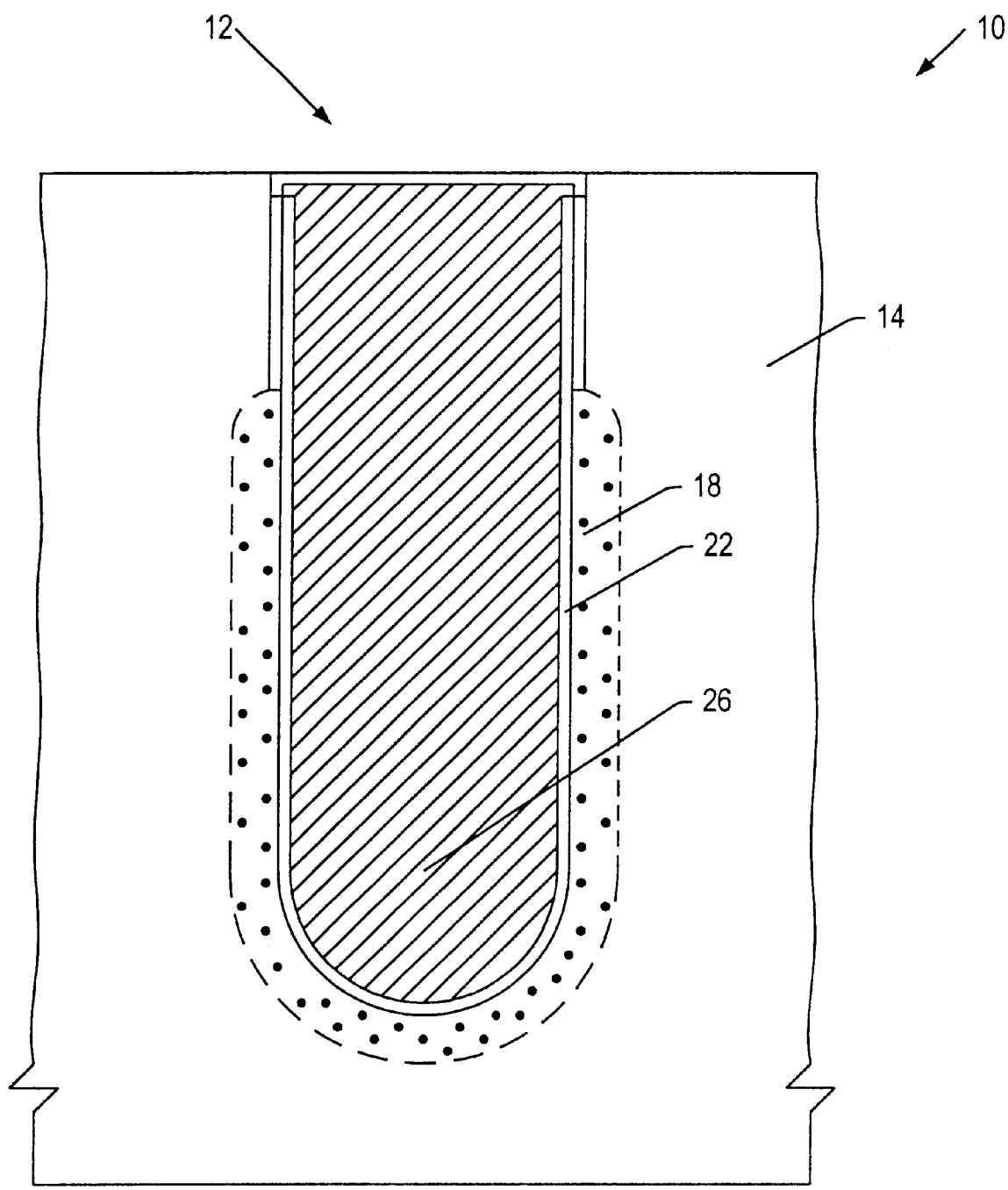

FIG. 1 shows a transverse cross-sectional view of a typical prior art trench type capacitor at 10. A trench 12 having sidewalls and a bottom is formed within a semiconductor substrate 14. The trench 12 is typically formed in the substrate 14 by a process of patterning and etching the substrate 14. Subsequently, a first conductor 18 is formed in a portion of the substrate 14 that envelopes a portion of the trench 12 by doping the inside walls and bottom surface of the trench 12 with arsenic ion (or phosphoric ion). The first conductor 18 is used as a bottom conductor, or "bottom electrode plate", of the conventional trench type trench capacitor 10. After forming the first conductor 18 by doping the semiconductor substrate 14 as described above, a dielectric layer 22 is formed typically by depositing a silicon nitride—silicon oxide layer (commonly referred to as an NO layer). After forming the dielectric layer 22, a second conductor 26 is formed by depositing amorphous silicon into the trench 12 and over the dielectric layer 22. The second conductor 26 provides a top conductor, or "top electrode plate", of the conventional trench type capacitor 10.

One problem associated with the depicted prior art deep trench capacitor 10 is that it provides only a limited amount of capacitance. The capacitance of the deep trench capacitor 10 is proportional to the surface areas of the first and second plates 18 and 26. It is possible to increase the capacitance of the deep trench capacitor 10 by increasing the size of the plates. However, increasing the size of the plates also increases the total size of the trench type capacitor which defeats the design goal of minimizing the size of the trench capacitor.

It is an object of the present invention to provide a deep trench capacitor having increased capacitance, and requiring a decreased amount of space. What is needed is a design and method of fabricating a deep trench capacitor having increased capacitance, and decreased size.

SUMMARY OF THE INVENTION

It is an object of the present invention to provide a deep trench capacitor having increased capacitance, and decreased size.

It is another object of the present invention to provide a process of fabricating a deep trench capacitor having increased capacitance, and requiring a decreased amount of space.

Briefly, a presently preferred embodiment of the present invention provides a process of fabricating a trench capacitor. The process includes the steps of: depositing a nitride masking layer over a top surface of a semiconductor substrate; patterning and etching to remove a portion of the nitride masking layer and a portion of the substrate to form an exposed deep trench in the substrate, and to expose an edge of the nitride masking layer, the trench having sidewalls and a bottom surface; forming an oxide fill plug to fill a bottom portion of the trench, the oxide fill plug extending from the bottom surface of the trench to a predetermined depth level below the top surface of the substrate; etching a portion of the sidewalls to form an etched back portion of the sidewalls located between the oxide fill plug and the top surface of the substrate; forming a collar insulating layer within the etched back portion of the sidewalls; forming a protection layer over the exposed edge of the nitride masking layer and over the collar insulating layer; and removing the oxide fill plug from the trench.

The process also includes the steps of: doping a region of the substrate enveloping the bottom portion of the trench; depositing a spacer insulating layer over the protection layer, the sidewalls, and the bottom surface of the trench; removing a portion of the spacer insulating layer to expose a substantially central portion of the bottom surface of the trench; depositing a conducting layer over the nitride masking layer, the spacer insulating layer, and the exposed central portion of the bottom surface, the conducting layer and the doped region of the substrate being in electrical contact and forming a first plate of the capacitor; depositing a photo resist fill plug into the trench and over the conducting layer, the photo resist fill plug providing protection of a bottom portion of the conducting layer, and leaving an unprotected portion of the conducting layer; removing the unprotected portion of the conducting layer to expose a top surface of the conducting layer; and removing the photo resist fill plug to expose inner walls of the conducting layer.

The process further includes the steps of: removing the spacer insulating layer to expose outer walls of the conducting layer, and leaving empty space between the outer walls and the sidewalls; removing the protection layer; forming a dielectric layer over the sidewalls of the trench and over the top surface, the inner walls, and the outer walls of the conducting layer; and depositing a conducting plug over the dielectric layer and filling the trench, the conducting plug forming at least a portion of a second plate of the capacitor.

An important advantage of a deep trench capacitor formed in accordance with the present invention is that it provides increased capacitance, and requires a decreased amount of space thereby optimizing the use of silicon real estate.

The foregoing and other objects, features, and advantages of the present invention will be apparent from the following detailed description of the preferred embodiment which makes reference to the several figures of the drawing.

IN THE DRAWING

FIG. 1 is a transverse cross-sectional view illustrating a typical prior art deep trench capacitor; and FIGS. 2 through 7 are cross-sectional views illustrating a progression of manufacturing steps in accordance with a process of manufacturing a deep trench capacitor in accordance with the present invention.

DETAILED DESCRIPTION OF THE PREFERRED EMBODIMENTS

FIGS. 2 through 7 are cross-sectional views illustrating a progression of manufacturing steps in accordance with a process of manufacturing a deep trench capacitor in accordance with the present invention.

Figure 2:
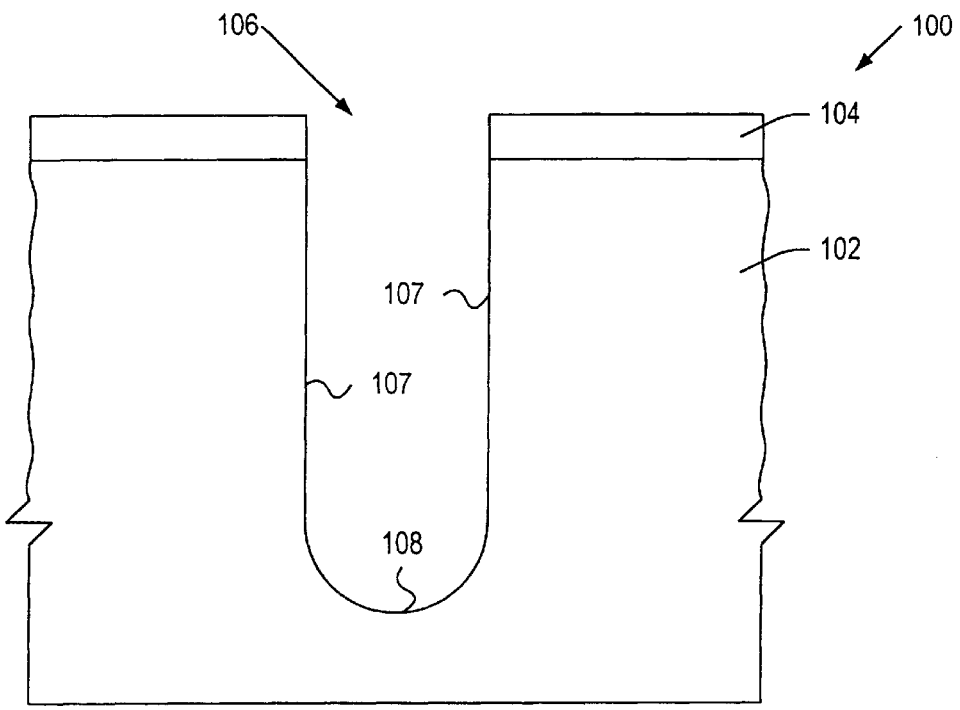

FIG. 2 shows a transverse cross-sectional view of a semiconductor trench structure at 100 formed in according with preliminary steps of the process of the present invetion for fabricating a deep trench capacitor A semiconductor substrate 102 is provided and a nitride masking layer 104 is subsequently deposited over the substrate 102. In one embodiment the nitride masking layer comprises silicon nitride. After depositing the nitride masking layer 104, the structure 100 is patterned and etched to form an exposed trench 106 having side walls 107 and a bottom surface 108. A portion of the nitride mask 104 is removed and an edge of the nitride mashing layer along the edge of the trench is exposed. In one embodiment, the etching step is an anisotropic etch process.

Figure 3:
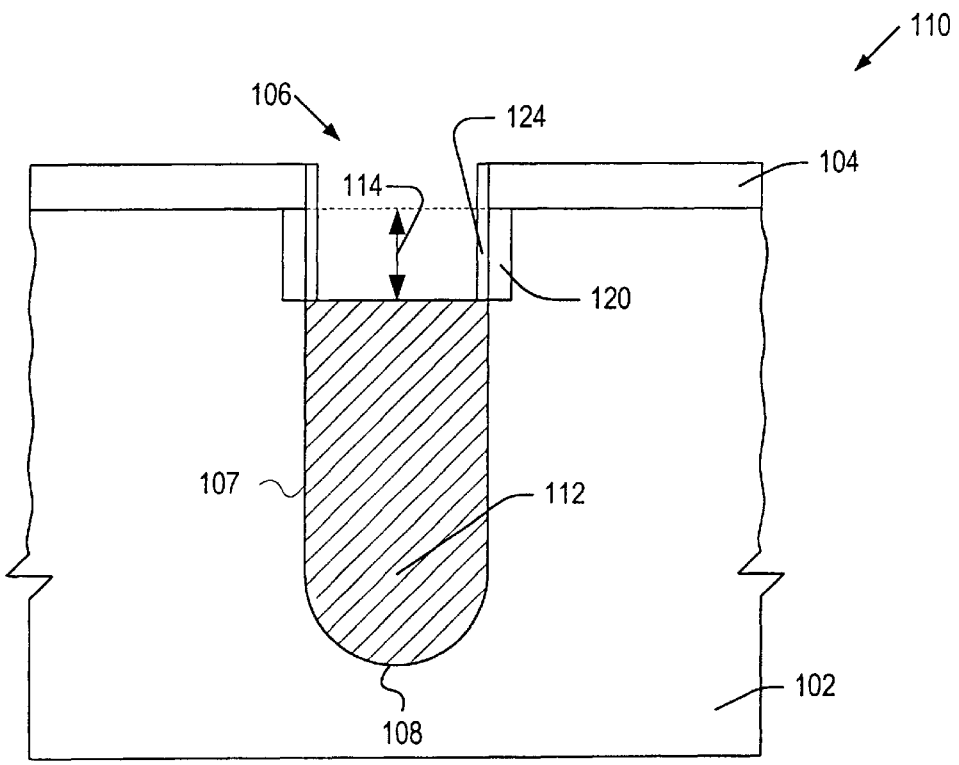

FIG. 3 shows a transverse cross-sectional view of a semiconductor trench structure at 110 that results from performance of additional steps of the process of the present invention on the semiconductor trench structure 100 (FIG. 2). A chemical vapor deposition (CVD) process is performed in order to form an oxide fill plug 112 in a bottom portion of the trench, the oxide fill plug 112 extending from the bottom surface 108 of the trench. In one embodiment, the oxide fill plug 112 includes a tetraethylorthosilicate layer (TEOS layer). In another embodiment, the oxide fill plug 112 includes silicon dioxide.

After depositing the oxide fill plug 112, an etching process is performed in order to etch back the oxide fill plug 112 to a predetermined depth 114 below the top surface of the substrate 102. The predetermined depth level 114 is approximately 1.3 microns. A thermal oxidation step is subsequently performed in order to form a collar insulating layer 120 within the etched back portion of the sidewalls 107 of the trench in the substrate 102. The collar insulating layer 120 is used to protect the capacitor and substrate 102 from unintentional contact with other devices (not shown). After forming the collar oxide layer 120, a protection layer 124 is formed on the collar insulating layer 120 to cover the exposed edges of the masking nitride layer 104 and the sidewalls 107 of the trench 106. The protection layer 124 is formed from silicon nitride in one embodiment of the present invention. The protection layer 124 provides an etch stop layer to protect the collar insulating layer at 120 from subsequent wet etching and ion implantation processes. After the collar insulating layer 120 and protection layer 124 are formed, a wet etching is performed in order to remove the oxide fill plug 112 from the trench 106. The oxide fill plug 112 defines the area where the collar insulating layer 120 and protection layer 124 are to be formed. Hence, the plug 112 can be removed after the collar insulating layer 120 and protection layer 124 are formed.

Figure 4:
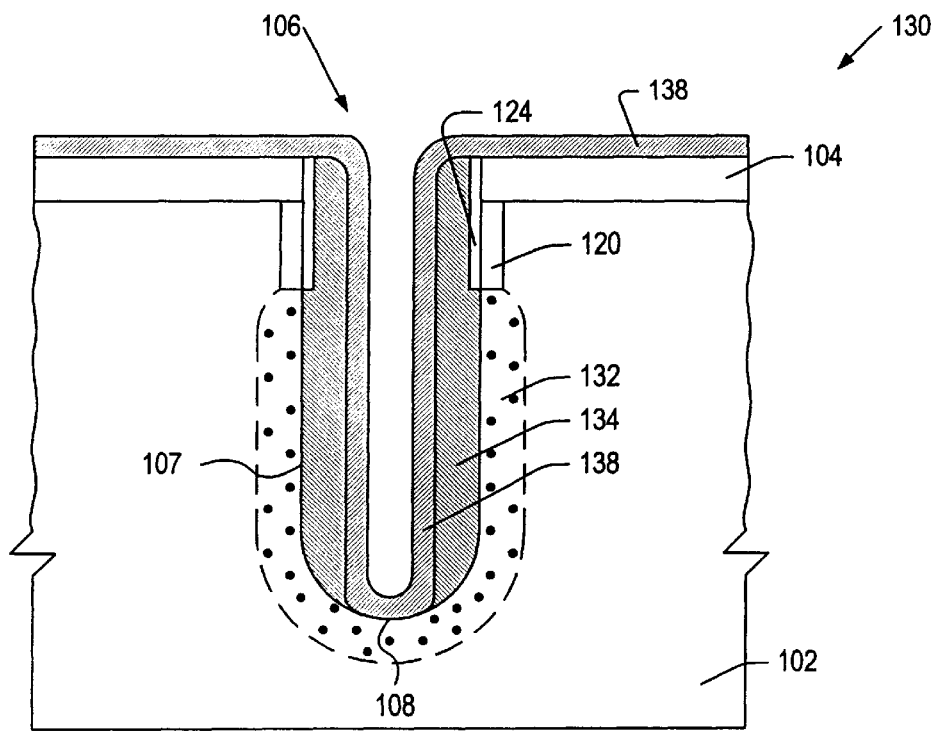

FIG. 4 shows a transverse cross-sectional view of a semiconductor trench structure at 130 that results from performance of further steps of the process of the present invention on the structure 110 (FIG. 3). After the oxide fill plug 112 (FIG. 3) is removed from the trench 106, a conventional ion implantation process is performed to dope a region 132 of the substrate 102 enveloping the bottom portion of the trench 106 below the collar insulating layer 120. During the doping process, the protection layer 124 and collar insulating layer 120 serve to protect an upper portion of the trench 106 from doping, while the sidewalls of the lower portion of the trench 112, as defined by the oxide fill plug 112 (FIG. 3) as described above, are exposed. The resulting doped region 132 of the substrate is substantially U-shaped in its transverse cross section, and envelopes the lower portion of the trench.

The doped region 132 provides a buried conductor which provides a portion of a bottom electrode plate of the deep trench capacitor formed in accordance with the present invention as further explained below. The doped region 132 forms a portion of a first plate or burined conducting plate of the capacitor as further explained below. Examples of ion impurities used to dope the region 132 of the semiconductor substrate 102 include N+ type ion impurities such as arsenic ion, and phosphoric ion. Examples of doping processes which may be used in accordance with the present invention for doping the doped region 132 include vapor phase doping, or an arsenic silicon glass (ASG) process in conjunction with annealing.

After doping the semiconductor substrate 102 as described above, a thin spacer insulating layer 134 is deposited into the trench 106 over the protection layer 124, over the sidewalls 107 of the trench 106 and on the bottom surface 108 of the trench 106. In one embodiment, the spacer insulator layer 134 is formed from low pressure tetraethylorthosilicate (LPTEOS). The spacer insulating 134 provides insulation in forming the first conductor as further explained below. After depositing the spacer insulating layer 134, an etch back process is performed in order to remove a substantially central portion of the spacer insulating layer 134 from the bottom surface 108 of the trench 106 to expose the bottom surface portion of the substrate 102 at the bottom of the surface of the trench 106.

Subsequently, a first conducting layer 138 is deposited over the nitride masking layer 104, and into the trench 106 over the spacer insulating layer 134 and over the exposed portion of the bottom surface 108 of the trench 106. In one embodiment, the first conducting layer is formed from doped amorphous silicon. The conducting layer 138 and the doped region 132 of said substrate are in electrical contact at the exposed portion of the bottom surface 108 of the trench. As further explained below, the conducting layer 138 and the doped region 132 form a first electrode plate of the capacitor.

Figure 5:
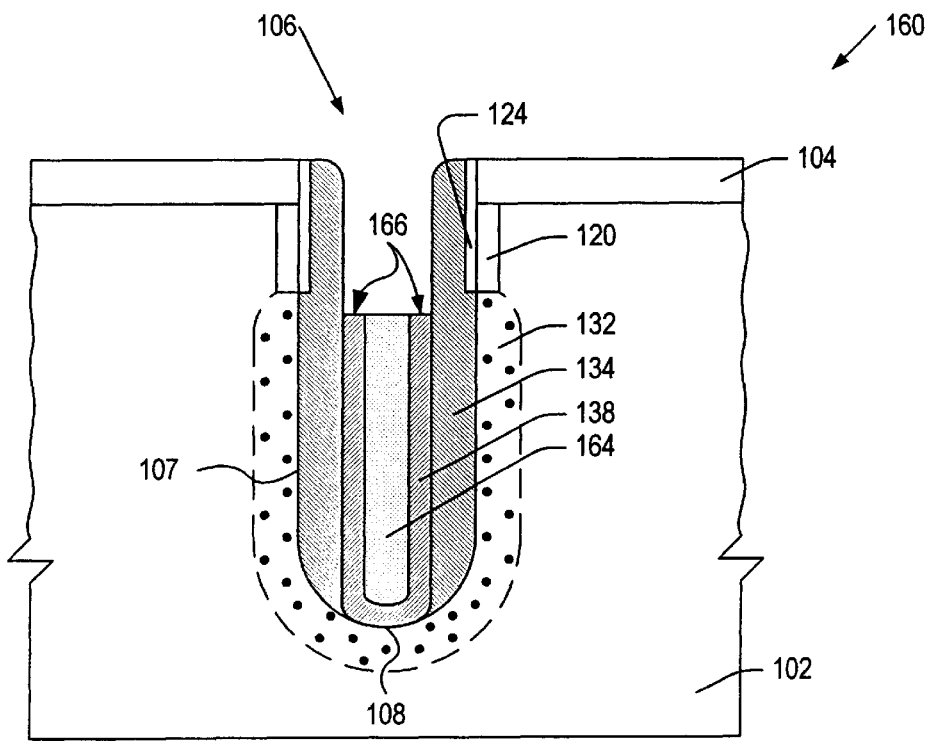

FIG. 5 shows a transverse cross-sectional view of a semiconductor trench structure at 160 that results from the performance of additional steps of the process of the present invention on the structure 130 (FIG. 4). A wet etching process is performed to remove a portion of the first conducting layer 138 (FIG. 4) that is disposed over the silicon nitride masking layer 104 in order to expose the nitride masking layer 104. A photoresist material 164 is deposited into and in order to fill the trench 106 and etched back to a height approximately right below the collar insulating layer 120. The photoresist material 164 provides protection for a portion of the first conducting layer 138 that is to be preserved. Subsequently, the unprotected portion of the first conducting layer 138 that is disposed above the photoresist material 164 is removed and a top surface 166 of the first conducting layer 138 is formed and left exposed. After removing the unprotected portion of the first conducting layer 138, the photoresist material 164 is removed to expose inner walls of the first conducting layer 138. Subsequently, the spacer insulating layer 134 is etched away to expose outer walls of the first conducting layer 138, and leaving empty space between the outer walls 184 (FIG. 6) and the sidewalls 107 of the trench.

After removing the spacer insulating layer 134, the protection layer 124 is removed. In one embodiment, the protection layer 124 is removed by applying phosphoric ($H_3PO_4$) acid.

Figure 6:
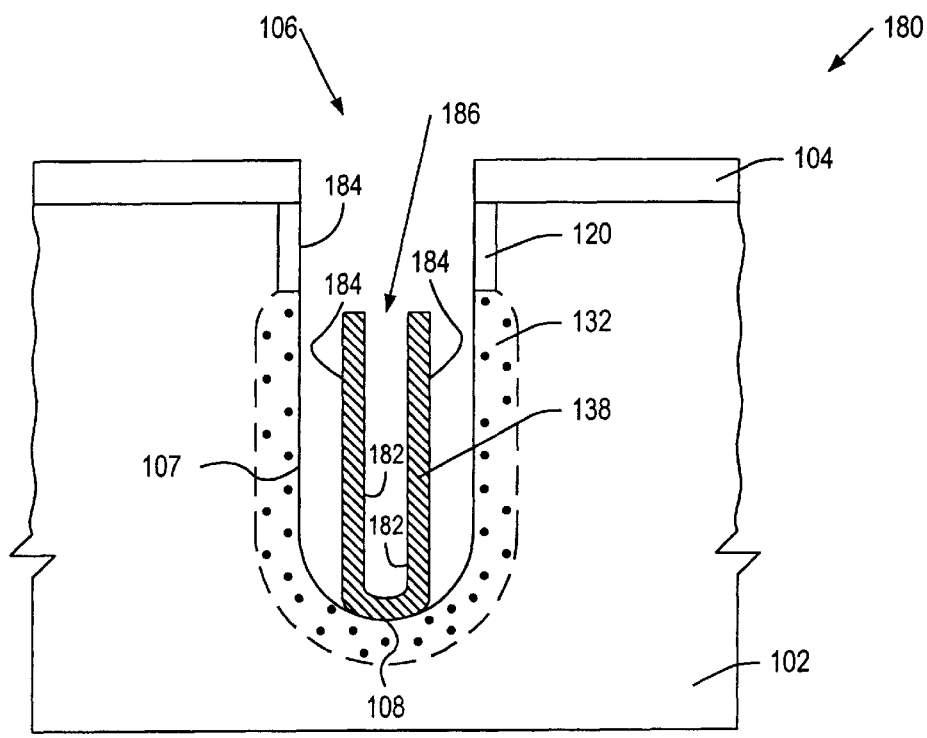

FIG. 6 shows a transverse cross-sectional view of a semiconductor trench structure at 180 that results from removing the spacer insulating layer 134 (FIG. 5) and the protection layer 124 (FIG. 5) from the structure 160 of FIG. 5. After the photoresist material 164 (FIG. 5) is removed as described above, opposing inner walls 182 of the conducting layer 138 are exposed. Also, after the spacer insulating layer 134 (FIG. 5) is etched away as described above, the outer walls 184 of the conducting layer 138 are exposed leaving empty space between the outer walls 184 of the conducting layer 138 and the sidewalls 107 of the trench. As shown in FIG. 6, the semiconductor trench structure 180 includes a conducting structure 186 that is formed by the remaining portion of the conducting layer 138. The conducting structure 186, which is substantially U-shaped in its transverse cross section, is electrically connected with the doped region 132 of the substrate 102. The doped region 132 and the conducting structure 186 form a bottom plate of a capacitor. In this structure, the area of the conducting plate is substantially increased and hence substantially increased the capacitance of the device.

Figure 7:
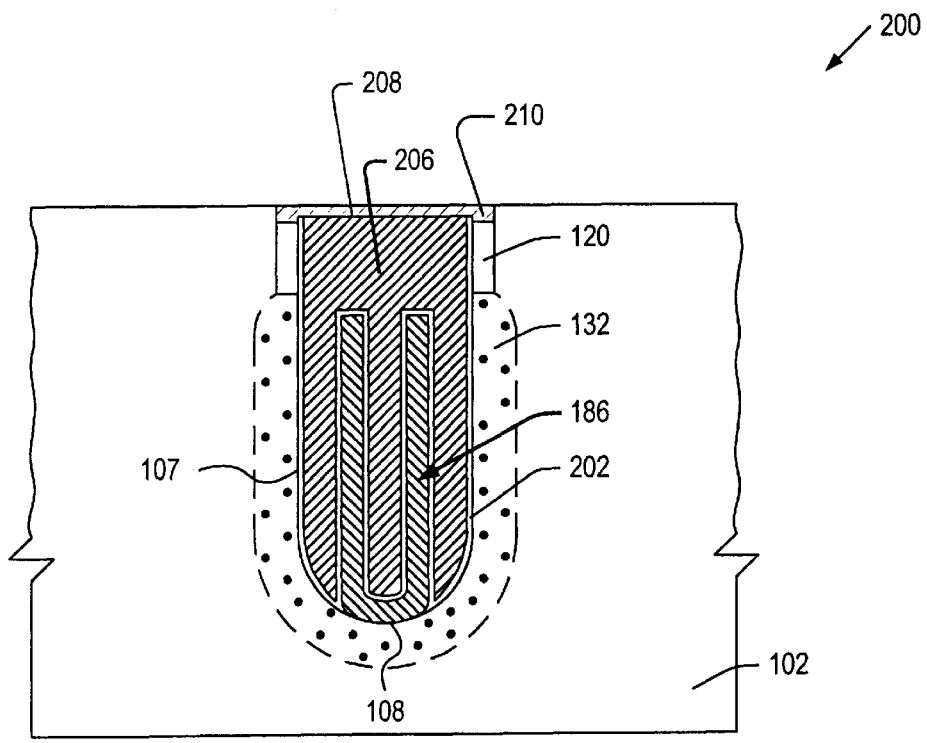

FIG. 7 shows a transverse cross-sectional view of a deep trench capacitor structure at 200 that results from the performance of additional steps of the process of the present invention on the structure 180 (FIG. 6). A dielectric layer 202 (FIG. 7) is formed over the sidewalls 107 of the trench 106 and over the top surface 166 (FIG. 5), inner walls 182 (FIG. 6), and outer walls 184 (FIG. 6) of the first conducting layer 138. In one embodiment, the dielectric layer 202 is formed from an oxide and silicon nitride composition layer (NO). The dielectric layer 202 provides a dielectric of a capacitor to be formed. Subsequently, a conducting plug 206 is deposited over the dielectric layer 202 to fill the trench 106. In one embodiment, the conducting plug 206 includes doped amorphous silicon.

Further steps in the process of the present invention include: removing the nitride masking layer 104 (FIG. 6); removing a portion of the conducting plug 206, a portion of the dielectric layer 202, and a portion of the collar insulating layer 120 to expose a top portion of the sidewalls 107, and forming a top surface 208 of the conducting plug that is disposed at a predetermined plug depth level below the top surface of the substrate 102. An open portion of the trench is defined at least in part by the predetermined plug depth level. In one embodiment, the predetermined plug is etched back to a depth approximately 0.16 microns below the top surface of the substrate 102. Subsequently, a buried strap polysilicon layer 210 (BS-POLY) is filled into the open portion of the trench 106. The BS-POLY layer 210 is electrically connected with the conducting plug 206, and provides for connection of the deep trench with other components (not shown) formed on the semiconductor substrate 102 such as a transistor.

An important advantage of the deep trench capacitor structure 200 formed in accordance with the present invention is that it provides increased capacitance, and requires a decreased amount of space thereby optimizing the use of silicon real estate.

Increased capacitance is achieved between the first plate, formed by the doped region 132 of the substrate which is in electrical contact with the conducting structure 186, and the second plate formed by the conducting plug 206. The dielectric layer 202 is disposed between a large surface area of the first plate (formed by the sidewalls of the trench at the doped region 132 of the substrate which is in electrical contact with the conducting structure 186 having the inner walls, outer walls, and top surface) and a large surface area of the second plate formed by the walls of the conducting plug 206 which oppose the sidewalls 107 of the doped region of the substrate, the inner walls 182 (FIG. 6) of the conducting structure 186, the outer walls 184 (FIG. 6) of the conducting structure 186, and the top surface 166 (FIG. 5) of the conducting structure 186. Increased capacitance is achieved by the large surface areas of the first and second plates. Space is conserved and increased capacitance is achieved by use of the substantially U-shaped transverse cross section of the conducting structure 186.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A deep trench capacitor structure formed in a semiconductor substrate, the structure comprising:

a substrate including a top surface, and a trench formed therein, said trench having sidewalls and a bottom surface, said substrate also having a doped region enveloping a lower portion of said trench;

a conducting structure disposed within said trench and including conductive means forming a plurality of walls disposed at a depth below the top surface of said substrate, some of said walls facing sidewalls of said trench, and some of said walls facing each other, said conductive means being affixed to said bottom surface of said trench and electrically connected with said doped region of said substrate, said doped region and said conducting structure forming a first plate of the capacitor structure;

a dielectric layer formed over the surfaces of said sidewalls and the surfaces of the walls of said conducting structure; and a conducting plug formed over said dielectric layer and having portions extending between said walls and between said walls facing said sidewalls, said conducting plug forming a second plate of the capacitor structure.

2. A deep trench capacitor structure formed in a semiconductor substrate, the structure comprising:

a substrate including a top surface, and a trench formed therein, said trench having sidewalls and a bottom surface, said substrate also having a doped region enveloping a lower portion of said trench;

a conducting structure disposed within said trench and having a substantially U-shaped transverse cross section, said conducting structure having a top surface that is disposed at a depth below the top surface of said substrate, outer walls facing said sidewalls of said trench, opposing inner walls, and a base portion that is affixed to said bottom surface of said trench and electrically connected with said doped region of said substrate, said doped region and said conducting structure forming a first plate of the capacitor structure, a dielectric layer formed over said sidewalls of said trench and over said top surface, said opposing inner walls, and said outer walls of said conducting structure; and a conducting plug formed over said dielectric layer and having portions extending between said facing walls and said sidewalls, and between said opposing walls, said conducting plug forming at least a portion of a second plate of the capacitor structure.

3. A deep trench capacitor structure as recited in claim 2 further comprising a collar insulating layer formed within an etched back portion of said sidewalls, said collar insulating layer being disposed between said doped region of said substrate and said top surface of said substrate.

4. A deep trench capacitor structure as recited in claim 2 wherein said collar insulating layer comprises oxide material.

5. A deep trench capacitor structure as recited in claim 2 wherein said dielectric layer comprises an oxide and silicon composition layer (NO layer).

6. A deep trench capacitor structure as recited in claim 2 wherein said conducting structure comprises doped amorphous silicon.

7. A deep trench capacitor structure as recited in claim 2 wherein said conducting plug comprises doped amorphous silicon.

* * * * *